(12) United States Patent
Nishimoto et al.

(10) Patent No.: US 7,663,860 B2
(45) Date of Patent: Feb. 16, 2010

(54) ELECTROSTATIC CHUCK

(75) Inventors: Shinya Nishimoto, Amagasaki (JP); Hiroyuki Nakayama, Nirasaki (JP); Hidetoshi Kimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 356 days.

(21) Appl. No.: 11/001,298

(22) Filed: Dec. 2, 2004

(65) Prior Publication Data

US 2005/0207088 A1   Sep. 22, 2005

(30) Foreign Application Priority Data

Dec. 5, 2003   (JP)   ............... 2003-408224

(51) Int. Cl.
*H01T 23/00*   (2006.01)

(52) U.S. Cl. .................... 361/234; 361/230

(58) Field of Classification Search .......... 361/230–234
See application file for complete search history.

(56) References Cited

U.S. PATENT DOCUMENTS

| | | | |
|---|---|---|---|
| 5,777,838 A | | 7/1998 | Tamagawa et al. |
| 5,810,933 A | | 9/1998 | Mountsier et al. |
| 6,028,762 A | * | 2/2000 | Kamitani .................... 361/234 |
| 6,077,357 A | * | 6/2000 | Rossman et al. .............. 118/728 |
| 6,117,246 A | | 9/2000 | Parkhe et al. |
| 6,261,708 B1 | * | 7/2001 | Ohashi et al. ............... 428/698 |
| 6,320,736 B1 | * | 11/2001 | Shamouilian et al. ........ 361/234 |
| 6,556,414 B2 | * | 4/2003 | Kosakai .................... 361/234 |
| 6,946,403 B2 | * | 9/2005 | Kellerman et al. .......... 438/758 |
| 6,960,743 B2 | * | 11/2005 | Hiramatsu et al. ......... 219/444.1 |
| 2002/0067585 A1 | * | 6/2002 | Fujiwara .................... 361/234 |
| 2004/0040665 A1 | * | 3/2004 | Mizuno et al. ........... 156/345.51 |
| 2004/0055709 A1 | * | 3/2004 | Boyd et al. ............. 156/345.51 |
| 2004/0060925 A1 | * | 4/2004 | Zhou et al. .................... 219/543 |

FOREIGN PATENT DOCUMENTS

| | | |
|---|---|---|
| JP | 5-6933 | 1/1993 |
| JP | 7-153825 | 6/1995 |
| JP | 9-172055 | 6/1997 |
| JP | 9-283607 | 10/1997 |
| JP | 10-284360 | 10/1998 |
| JP | 2000-277594 | 10/2000 |
| JP | 2000-332091 | 11/2000 |
| JP | 2001-308075 | 11/2001 |
| JP | 2001-351966 | 12/2004 |
| WO | WO 99/16122 | 4/1999 |

* cited by examiner

*Primary Examiner*—Danny Nguyen
(74) *Attorney, Agent, or Firm*—Oblon, Spivak, McClelland, Maier & Neustadt, L.L.P.

(57) ABSTRACT

An electrostatic chuck for attracting and holding a substrate by using an electrostatic force includes a plurality of protrusion portions to be brought into contact with the substrate. The protrusion portions are formed of a ceramic dielectric including grains each having a specified particle diameter, and contact surfaces of the protrusion portions with the substrate are formed to have a surface roughness depending on the particle diameter.

16 Claims, 9 Drawing Sheets

ELECTROSTATIC CHUCK

FIELD OF THE INVENTION

The present invention relates to an electrostatic chuck for attracting and holding a substrate by employing an electrostatic force; and, more particularly, to an electrostatic chuck capable of improving abrasion resistance thereof and controlling the in-surface temperature of the substrate to be at a desired level during a processing of a substrate.

BACKGROUND OF THE INVENTION

As shown in FIG. 12, for example, a conventional electrostatic chuck 1 is employed as a part of a mounting body of a plasma processing apparatus in case of performing a plasma processing on a substrate (for example, wafer) W. Specifically, the electrostatic chuck 1 is used to attract and hold the wafer W on a top surface of the mounting body 2 by using an electrostatic force. Further, a focus ring 3 is disposed around a mounting surface of the mounting body 2 to surround the wafer W placed on the electrostatic chuck 1.

Moreover, a high frequency power supply 4 is connected to the mounting body 2 via a matching unit 4A. By applying thereto a predetermined high frequency power from the high frequency power supply 4 under a preset vacuum level, a plasma of a processing gas is generated between the mounting body 2 and an upper electrode (not shown), and the plasma thus generated is concentrated on the top surface of the wafer W by the focus ring 3. Formed inside the mounting body 2 is a coolant passageway 2A through which a coolant circulates to cool the mounting table 2, to thereby maintain the temperature of the wafer W at a predetermined level. Further, a gas channel 2B for a thermally conductive gas (for example, a He gas) is also formed inside the mounting body 2, wherein the gas channel 2B is opened at plural locations on the top surface of the mounting body 2.

The electrostatic chuck 1 is provided with through holes 1A corresponding to the gas channel 2B. The He gas supplied from the gas channel 2B is introduced into a gap between the mounting body 2 and the wafer W via the through holes 1A to thereby make a fine gap between the electrostatic chuck 1 and the wafer W become thermally conductive such that the wafer W can be efficiently cooled by the mounting body 2. The electrostatic chuck 1 is formed of, for example, sintered alumina or ceramic obtained by alumina thermal spraying, and an electrostatic plate 1B connected to a DC power supply 5 is embedded therein. The electrostatic chuck 1 attracts and holds the wafer W by using an electrostatic force generated by a high voltage applied from the DC power supply 5. Moreover, a plurality of vertically movable lifter pins (not shown) is installed in the mounting body 2 in order to perform loading/unloading of the wafer W onto/from the electrostatic chuck 1.

However, in case of an electrostatic chuck obtained by ceramic spraying, its wafer adsorption surface is weak, so that, for example, particles generated from the material of the wafer adsorption surface are likely to stick to a bottom surface of the wafer W, causing cross-contamination during a cleaning operation of the wafer W. Furthermore, the surface of the electrostatic chuck 1 may be roughened gradually as the adsorption and the separation process of the wafer W are repeated, and such a change in the surface state of the electrostatic chuck 1 makes it impossible to control the temperature of the wafer as in the initial stage. As a result, the temperature of the wafer gets changed with time.

Meanwhile, electrostatic chucks 1 formed of, e.g., sintered alumina are disclosed in, for example, Japanese Patent No. 3348140 ("Reference 1") and Japanese Patent Publication No. 2000-332091 ("Reference 2"). Reference 1 discloses an electrostatic chuck featuring an improved corrosion resistance of a halogen based gas against a plasma while Reference 2 describes an electrostatic chuck provided with a multiplicity of dots on the surface thereof. Such electrostatic chucks can eliminate the above-mentioned problems.

In case of the electrostatic chuck disclosed in Reference 1, however, though the plasma resistance can be improved, there is a likelihood that, when the wafer W is separated from the electrostatic chuck by using lifter pins, the wafer W springs up by the lifter pins due to an attraction force of residual electric charges of the electrostatic chuck since the gap between the electrostatic chuck and the wafer W is narrow while the electrostatic capacitance of the electrostatic chuck is great, as in the case of the electrostatic chuck obtained by the ceramic spraying.

In case of the electrostatic chuck disclosed in Reference 2, since the multiplicity of dots are provided on the wafer adsorption surface, the problem of the wafer's springing up can be solved. However, the dots of the electrostatic chuck are of a low height of 5 μm or less, so that it is difficult to allow a thermally conductive gas to be uniformly distributed over the entire surface of the wafer W even though the thermally conductive gas is supplied into the gap between the electrostatic chuck and the wafer W. As a consequence, a rapid control of the wafer temperature cannot be realized. Moreover, though groove portions are radially provided on the surface of the electrostatic chuck in order to distribute the thermally conductive gas over the entire surface of the wafer W, there frequently occurs a difference in heat transfer between the groove portions and the other portions, making it difficult to uniformly control the in-surface temperature of the wafer. Furthermore, since the contact area of the dots and the wafer W amounts to about 20%, which is great, a desired temperature or a desired temperature distribution cannot be obtained by using the thermally conductive gas. Still further, it is not sure that this electrostatic chuck has a plasma resistance.

SUMMARY OF THE INVENTION

The present invention has been conceived to solve the conventional problems described above. It is, therefore, an object of the present invention to provide an electrostatic chuck which is capable of improving plasma resistance and abrasion resistance thereof, and controlling the in-surface temperature of a substrate to be at a desired level or in a desired temperature distribution uniformly and rapidly, while preventing the substrate from springing up due to residual electric charges.

In accordance with an aspect of the present invention, there is provided an electrostatic chuck for attracting and holding a substrate by using an electrostatic force, including: a plurality of protrusion portions to be brought into contact with the substrate, wherein the protrusion portions are formed of a ceramic dielectric including grains each having a specified particle diameter, and each contact surface of the protrusion portions with the substrate is formed to have a surface roughness depending on the particle diameter.

Preferably, the particle diameter ranges from 1 to 2 μm and the surface roughness of each contact surface ranges from Ra 0.2 μm to 0.3 μm.

Preferably, a principal component of the ceramic dielectric is aluminum oxide.

Preferably, the ceramic dielectric includes silicon carbide.

Preferably, each protrusion portion is set to have a hardness of Vicker's hardness Hv2000 or greater.

Preferably, a contact area percentage of the protrusion portions per unit area of the substrate is set to be not greater than 15%.

Preferably, the protrusion portions are formed of columnar protrusions, each having a diameter of 0.5 mm or less.

Preferably, a distance between the protrusion portions is set to be not greater than 1 mm.

Preferably, each protrusion portion is set to have a height of 30 μm or greater.

Preferably, the surface roughness of the contact surface is set to a level that can be reached by a plasma cleaning with the lapse of time.

In accordance with another aspect of the present invention, there is provided an electrostatic chuck for attracting and holding a substrate by using an electrostatic force, the electrostatic chuck having a mechanism for supplying a thermally conductive gas to a backside of the substrate without using grooves to cool the substrate, the electrostatic chuck including: a plurality of protrusion portions to be brought into contact with the substrate, wherein a percentage of a contact area of the protrusion portions per unit area of the substrate is set to 15% or less and each protrusion portion is set to have a height of 30 μm or greater.

Preferably, the protrusion portions are columnar protrusions, each having a diameter of 0.5 mm or less.

Preferably, a surface roughness of the contact surface is set to 0.25 μm or less.

Preferably, a distance between the protrusion portions is set to 1 mm or less.

Preferably, the electrostatic chuck has a first and a second annular projection portion at an outer peripheral portion and an inner portion thereof, respectively, the first and the second annular projection portion being brought into contact with the substrate; and first and second gas supply ports for supplying a thermally conductive gas into a first region formed between the first and the second annular projection portion and a second region formed inside the second annular projection portion, respectively.

Preferably, the second annular projection portion is set to have a width ranging from 1.0 mm to 1.5 mm, and a distance between the second annular projection portion and the protrusion portions adjacent thereto is set to be not greater than 2 mm.

In accordance with still another aspect of the present invention, there is provided an electrostatic chuck for attracting and holding a substrate by using an electrostatic force, including: a first and a second annular projection portion respectively formed at an outer peripheral portion and an inner portion of the electrostatic chuck, the first and the second annular projection portion being brought into contact with the substrate; and first and second gas supply ports for supplying a thermally conductive gas into a first region formed between the first and the second annular projection portion and a second region formed inside the second annular projection portion, respectively.

Preferably, the first and the second region have a plurality of first and second protrusion portions different from the first and the second annular projection portion, respectively, and the first and the second protrusion portion are different from each other in at least one of a contact area per unit area with the substrate, a density and a height.

Preferably, a percentage of the contact area per unit area between the first protrusion portions and the substrate is set to be greater than that of the contact area per unit area between the second protrusion portions and the substrate.

Preferably, the percentage of the contact area between the second protrusion portions and the substrate is set to be not greater than 15%.

Preferably, the first protrusion portions are set to have a height lower than that of the second protrusion portions.

Preferably, the second protrusion portions are set to have a height of 30 μm or greater.

Preferably, the density of the first protrusion portions is set to be greater than that of the second protrusion portions.

Preferably, each of the first and the second protrusion portions has a columnar shape with a same diameter not greater than 0.5 mm. In accordance with the present invention, there is provided an electrostatic chuck capable of improving plasma resistance and abrasion resistance, uniformly controlling the in-surface temperature over the entire surface of the substrate, and making the temperature controllability of the substrate stable.

BRIEF DESCRIPTION OF THE DRAWINGS

FIGS. 6A and 6B represent graphs illustrating results of a thermal conduction analysis for observing an effect of surface grooves of an electrostatic chuck on a wafer temperature, wherein FIG. 6A shows a relationship between a width of each groove and a temperature distribution of the wafer in the vicinity thereof, and FIG. 6B shows a temperature difference distribution thereof.

FIGS. 7A and 7B respectively offer graphs showing results of a thermal conduction analysis for observing an effect of annular projections of the electrostatic chuck on a wafer temperature, wherein FIG. 7A shows a relationship between a sealing width and a temperature distribution of the wafer in the vicinity thereof, and FIG. 7B illustrates a temperature difference distribution thereof.

DETAILED DESCRIPTION OF THE PREFERRED EMBODIMENTS

An electrostatic chuck in accordance with the present invention was used in, for example, a plasma processing apparatus, and desirable results could be obtained. Hereinafter, the electrostatic chuck employed in the plasma processing apparatus will be explained as an example.

The present invention will be described based on a preferred embodiment illustrated in FIGS. 1 to 11.

Figure 1:
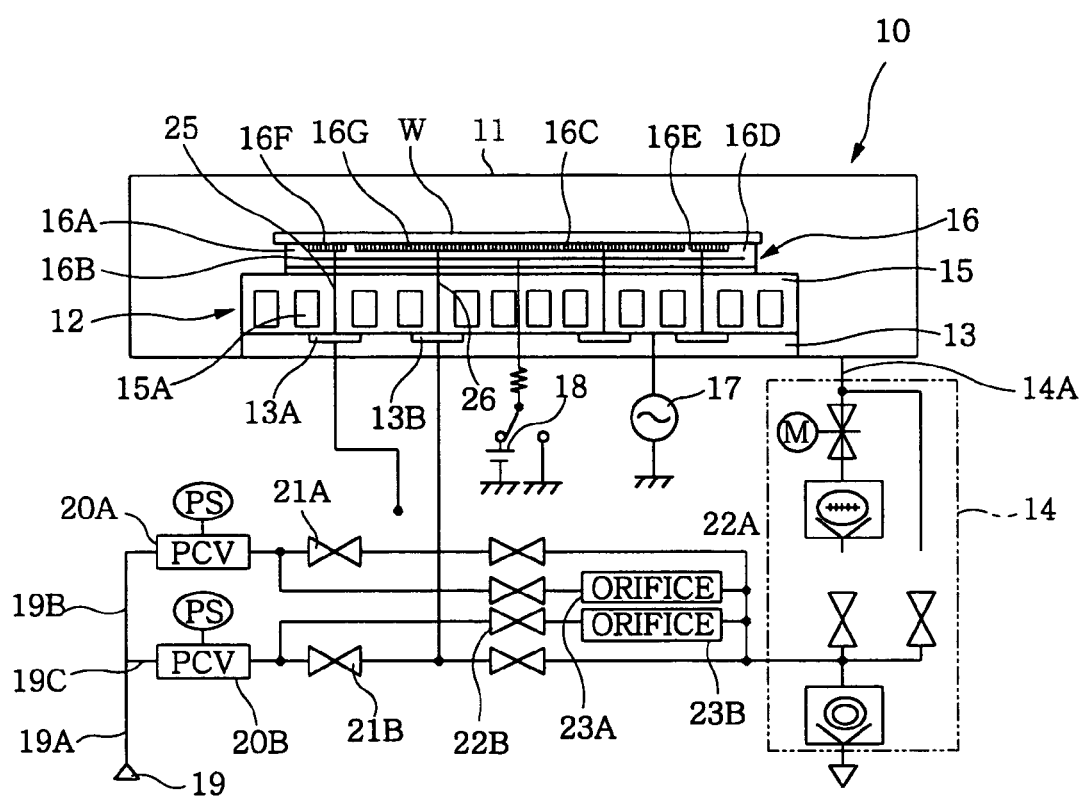
FIG. 1 is a diagram showing a plasma processing apparatus to which an electrostatic chuck in accordance with a preferred embodiment of the present invention is applied.

As shown in FIG. 1, for example, a plasma processing apparatus 10 in accordance with the present invention includes a chamber 11 capable of being maintained at a high vacuum level; a mounting body 12 disposed in the chamber 11 to mount thereon a substrate (for example, wafer) W; and an insulator 13 for electrically insulating the mounting body 12 from the chamber 11. Such a plasma processing apparatus 10 is configured to perform a preset plasma processing on the wafer W within the chamber 11 which is maintained at a predetermined vacuum level by a vacuum exhaust system 14 connected to the chamber 11 via a gas exhaust line 14A.

The mounting body 12 includes an electrode 15 and an electrostatic chuck 16 attached on the electrode 15 via an adhesive. A high frequency power supply 17 is connected to the electrode 15, and a plasma is generated within the chamber 11 by applying a predetermined high frequency power to the electrode 15 from the high frequency power supply 17. Furthermore, a coolant path 15A is formed inside the electrode 15, and the temperature of the wafer W is controlled to be at a predetermined level via the electrode 15 and the electrostatic chuck 16 by supplying a preset coolant into the coolant path 15A. A high voltage DC power supply 18 is connected to the electrostatic chuck 16, as will be described later, and an electrostatic force of the electrostatic chuck 16 is generated by applying a high voltage to the electrostatic chuck 16 from the high voltage DC power supply 18, whereby the wafer W is attracted by the electrostatic chuck 16 to be held thereon.

Further, a thermally conductive gas such as a He gas is supplied to the mounting body 12, and the temperature of the wafer W is controlled to be uniform over the entire surface thereof by increasing thermal conductivity between the electrostatic chuck 16 and the wafer W by means of the thermally conductive gas, as will be described later. That is, a gas supply source 19 for supplying the thermally conductive gas is connected to the mounting body 12 via a gas line 19A, and the gas line 19A branches out into a first and a second branch line 19B and 19C of a dual system. Further, a first and a second gas pressure control valve 20A and 20B and valves 21A and 21B are installed on the first and the second branch line 19B and 19C, respectively. The first and the second branch line 193 and 19C are respectively closed and opened by using the valves 21A and 21B, and the pressure of the thermally conductive gas is controlled by means of the gas pressure control valves 20A and 20B. The first and the second branch line 19B and 19C branch out again at an upstream side of the valves 21A and 21B, and are connected to the vacuum exhaust system 14 via valves 22A and 22B and orifices 23A and 23B, respectively. The pressure of the thermally conductive gas is maintained at a preset supply level by the vacuum exhaust system 14.

Figure 2:
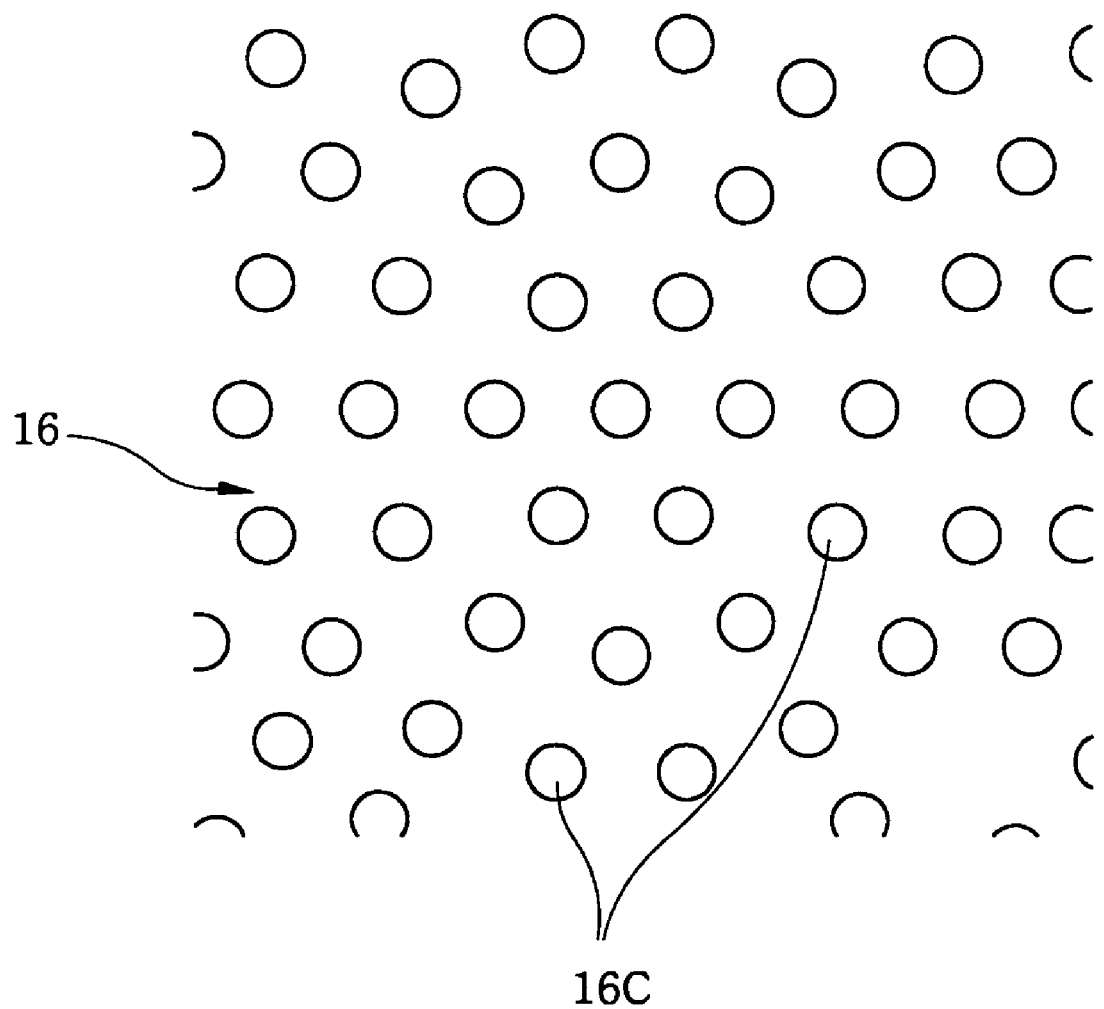
FIG. 2 shows an enlarged plan view illustrating a distribution state of protrusions of the electrostatic chuck illustrated in FIG. 1.
Figure 4:
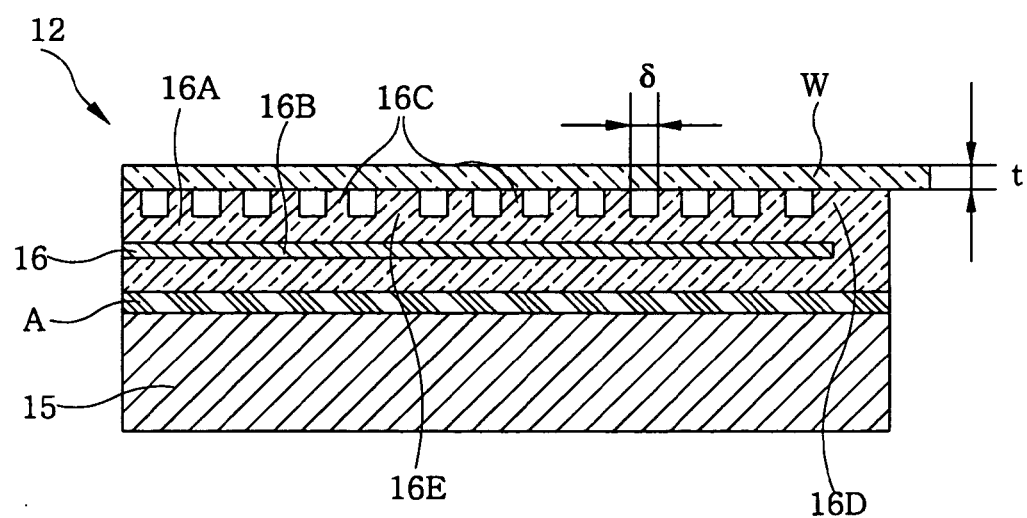
FIG. 4 provides an enlarged cross sectional view partially depicting main parts of the electrostatic chuck shown in FIG. 1.

Further, as can be seen from FIGS. 1, 2 and 4, the electrostatic chuck 16 includes a ceramic dielectric 16A attached on the electrode 15 via an adhesive A; and an electrode layer 16B embedded in the ceramic dielectric 16A. A plurality of protrusions 16C is formed on an adsorption surface of the electrostatic chuck 16, i.e., on the top surface of the ceramic dielectric 16A such that they are uniformly distributed over the substantially entire surface. By providing the plurality of protrusions 16C, the influence of the residual electric charges on the electrostatic chuck 16 can be reduced, and the wafer W can be prevented from springing up when it is separated from the electrostatic chuck 16. The protrusions 16C are disposed spaced apart from each other at approximately regular intervals, as shown in FIG. 2, for example, and the top surfaces of the protrusions 16C are flattened to serve as contact surfaces to be brought into contact with the wafer W.

The contact area between the protrusions 16C and the wafer W is preferably set to be not greater than 15% per unit area of the wafer W. The control of the wafer temperature through the use of the thermally conductive gas can be performed more easily as the percentage of the contact area to the wafer W becomes smaller. However, if this percentage becomes excessively small, a heat transfer between the wafer W and the coolant via the protrusions 16C formed of ceramic having a thermal conductivity greater than that of the thermal conductivity gas may become reduced, resulting in an increase in a steady-state temperature of the wafer W. It is not preferable that the percentage of the contact area to the unit area of the wafer W exceeds 15%, for the temperature controllability through the use of the thermally conductive gas is reduced in such a case. In this preferred embodiment, the percentage is set to be 15% in order to obtain desired steady-state temperature and temperature controllability.

The wafer temperature controllability through the use of the thermally conductive gas is greatly changed depending on a total gas contact area of lower surfaces between the protrusions 16C and lateral surfaces of the protrusions 16C. That is, the heat transfer to the wafer W via the thermally conductive gas is carried out through a heat transfer via the lower surfaces between the protrusions 16C and the lateral surfaces of the protrusions 16C in addition to the heat transfer from the portions that are in direct contact with a bottom surface of the wafer W. Therefore, the heat transfer via the thermally conductive gas is facilitated as the total gas contact area is increased.

With a same total contact area between the wafer W and the protrusions 16C, it is preferable to increase the heights of the protrusions 16C to enlarge the area of the lateral surfaces of the protrusions 16C, to thereby increase the total gas contact area. Furthermore, in case the protrusions 16C are formed such that each of them has a same horizontal cross sectional shape at any height, it is preferable to reduce the horizontal cross sectional area of each protrusion 16C because the total gas contact area increases with the decrease of the horizontal cross sectional area (the contact surface being in contact with the wafer W) of each protrusion 16C.

It is preferable to configure the protrusions 16C such that the percentage of the contact area between the wafer W and the protrusions 16C per unit area (i.e., surface contact portions of the protrusions/the area of the wafer W×100%) is not greater than 15% . When the temperature controllability of the wafer is considered, each of the protrusions 16C preferably has a diameter of 0.5 mm or less and a height of 30 μm or greater, more preferably, a height of 40 μm or greater. Further, if an aspect ratio of the diameter and the height (height/diameter) of each protrusion 16C is greater than 1, there is a likelihood that the protrusions 16C suffer from damages caused by, e.g., the wafer W rubbing thereon. Therefore, it is preferred that a lower limit of the diameter and an upper limit of the height of the protrusions 16C are set such that the aspect ratio is not greater than 1. Each protrusion 16C is formed to have, for instance, a columnar shape with a horizontal cross sectional diameter of 0.5 mm and a height of 30 μm.

In order to increase the total area of the lateral surfaces of the protrusions 16C, the horizontal cross sections thereof may be formed to have an elliptic shape or a quadrilateral shape instead of the circular shape, and the lateral surface of each protrusion 16C may be inclined or stepped, instead of the upright shape, such that a cross section of a lower portion thereof becomes larger than that of an upper portion. Moreover, in order to suppress particles generated by a cutting, top edge portions of the protrusions 16C are preferably rounded. In such a case, contact surfaces with the wafer W refer to only the portions that are brought into contact with the wafer W excluding the rounded portions.

Furthermore, a distance δ between the plurality of protrusions 16C as shown in FIG. 4 is set to be not greater than 2 mm, preferably not greater than 1 mm and more preferably approximately equal to or smaller than the thickness t of the wafer W. By setting the distance δ to be equal to the thickness t, a time period required to transfer an amount of heat from the top surface of each protrusion 16C to a top surface of the wafer W becomes substantially identical to a time period needed to deliver the same amount of the heat from each protrusion 16C to its neighboring protrusion 16C. As a result, a temperature difference at the top surface of the wafer W between the protrusions 16C and space portions becomes reduced.

Figure 5:
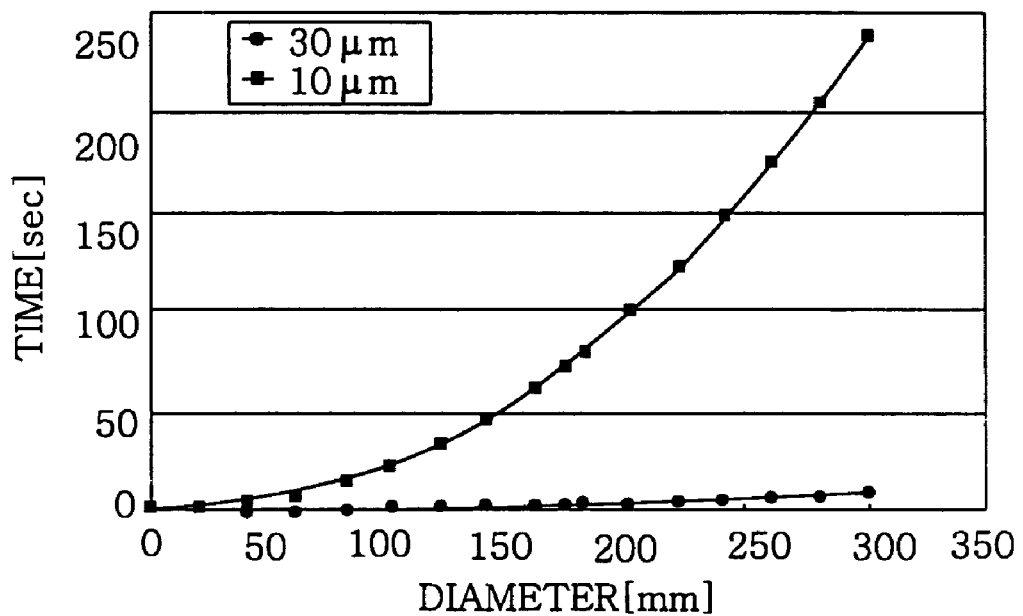
FIG. 5 presents a graph showing a relationship between a height of the protrusions of the electrostatic chuck illustrated in FIG. 1, and a travel distance and a travel time of a thermally conductive gas on a wafer.

Further, it is preferable that the protrusions 16C have an increased height because higher protrusions 16C can allow the thermally conductive gas to disperse through the entire space between the electrostatic chuck 16 and the wafer W more rapidly. Therefore, the height of each protrusion 16C is preferably set to be 30 μm or greater, as described above and more preferably, 40 μm or greater. In case the height of each protrusion 16C is less than 30 μm, the time period required for the thermally conductive gas to disperse through the entire space between the electrostatic chuck 16 and the wafer W is increased, which may cause deterioration in the temperature controllability of the wafer. This has been proven by data in FIG. 5. FIG. 5 is a graph showing a relationship between time and a travel distance of the thermally conductive gas on the wafer W in each of cases where the protrusions 16C have heights of 10 μm and 30 μm, respectively. As can be seen from FIG. 5, in case the height of the protrusions is 10 μm, the time period required for the thermally conductive gas to reach the entire region of the wafer W becomes sharply increased as the distance from the gas supply source becomes increased, whereas it is found that the thermally conductive gas reaches the entire region of the wafer W almost instantaneously when the height of the protrusions 16C is set to be 30 μm or greater.

In case of the protrusions 16C having a lower height, for example, 10 μm, it was required to provide a gas diffusion mechanism such as grooves at a bottom portion at which the protrusions 16C are provided, to thereby allow the thermally conductive gas to be diffused rapidly via the gas diffusion mechanism to reach the entire surface of the wafer W in a short period of time. In this preferred embodiment, however, the installation of the gas diffusion mechanism is not needed by setting the heights of the protrusions 16C to be greater, e.g., 30 μm or greater, as described above. As a consequence, manufacturing costs thereof can be reduced, and there is no problem such as a temperature nonuniformity in the grooves.

Figure 3:
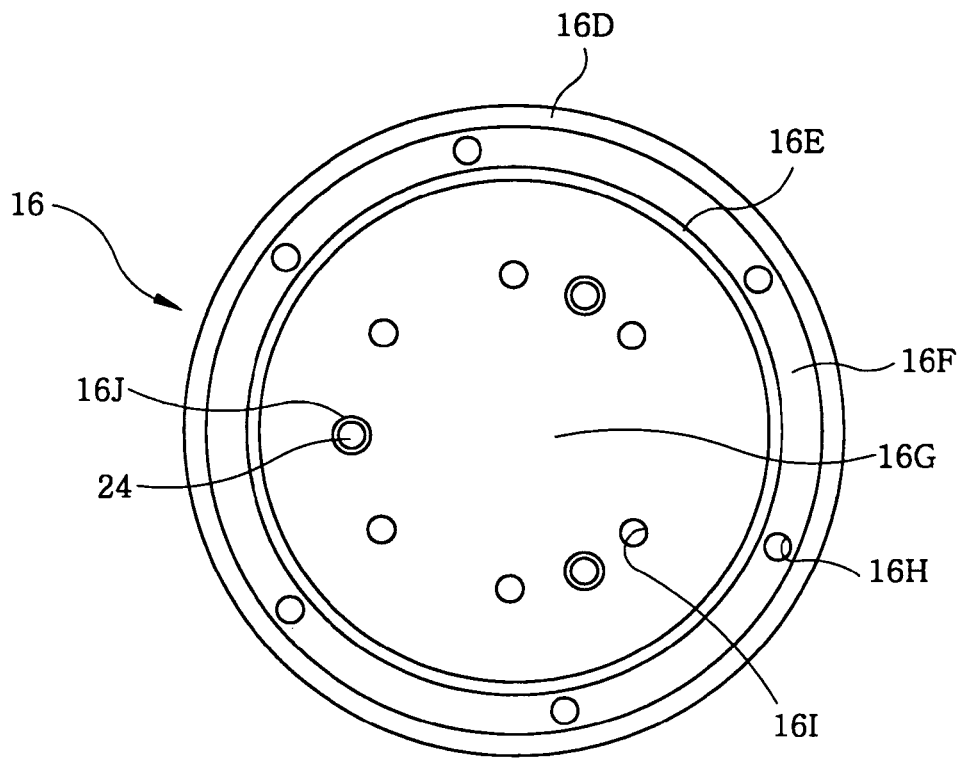
FIG. 3 depicts a plan view describing the electrostatic chuck illustrated in FIG. 1.

Furthermore, as shown in FIGS. 1 and 3, a first annular projection 16D is formed on the outer peripheral portion of the electrostatic chuck 16, wherein the height of the first annular projection 16D is identical to that of the protrusions 16C. The first annular projection 16D serves as a seal ring for confining the thermally conductive gas, which is supplied into the gap between the electrostatic chuck 16 and the wafer W, on the surface of the wafer W. Further, concentrically formed inside the first annular projection 16D is a second annular projection 16E whose height is configured to be identical to that of the protrusions 16C. The second annular projection 16E divides the inside region of the first annular projection 16D into two. That is, as can be seen from FIG. 3, a ring-shaped first region 16F is formed between the first annular projection 16D and the second annular projection 16E while a circular second region 16G is formed inside the second annular projection 16E. The second annular projection 16E serves as a seal ring between the first and the second region 16F and 16G. In FIG. 3, the protrusions 16C are not shown.

With the above configuration, when the wafer W is electrostatically attracted and held by the electrostatic chuck 16, the wafer W is brought into contact with the protrusions 16C and the first and the second annular projection 16D and 16E. As a result, two spaces corresponding to the first and the second region 16F and 16G are formed between the wafer W and the electrostatic chuck 16. Hereinafter, the two spaces corresponding to the first and the second region 16F and 16G will be referred to as a first and a second space 16F and 16G, respectively, if necessary.

Further, a plurality of first gas supply ports 16H and a multiplicity of second gas supply ports 16I are formed in the first and the second region 16F and 16G, respectively, as shown in FIG. 3. Moreover, the first and the second gas supply ports 16H and 16I are connected to the first and the second branch line 19B and 19C, respectively, as will be described hereinafter in detail. In FIG. 3, reference numeral 16J represents holes through which the lifter pins 24 move up and down.

The first and the second branch line 19B and 19C are coupled to a first and a second annular recess 13A and 13B formed on the top surface of the insulator 13, respectively, as shown in FIG. 1, and the thermally conductive gas is supplied into the annular recesses 13A and 13B. Further, as shown in the same drawing, a first and a second communication path 25 and 26 respectively communicating with the first and the second region 16F and 16G are formed through the electrode 15 and the electrostatic chuck 16. Accordingly, the thermally conductive gas from the gas supply source 19 is introduced into the first and the second space 16F and 16G of the electrostatic chuck 16 via the first and the second annular recess 13A and 13B and the first and the second communication path 25 and 26, respectively.

By dividing the space between the electrostatic chuck 16 and the wafer W into the first and the second space 16F and 16G by means of the first and the second annular projection 16D and 16E, the pressures of the thermally conductive gas supplied into the spaces 16F and 16G can be controlled individually. While the plasma processing of the wafer W is executed, the temperature of the outer peripheral portion of the wafer W is increased to be higher than that of the inner portion thereof. Accordingly, by setting the thermal conductivity in the first space 16F to be higher than that in the second space 16F, the temperature of the wafer W can be controlled uniformly over the entire surface thereof. For example, the pressure of the thermally conductive gas in the first space 16F is set to be high, e.g., 40 Torr and the pressure of the thermally conductive gas in the second space 16G is set to be low, e.g., 10 Torr.

Further, where the protrusions 16C located in the first and the second space 16F and 16G are defined as first and second protrusions, respectively, by setting a percentage of the contact area between the first protrusions and the wafer W to be greater than that of the contact area between the second protrusions and the wafer W, the thermal conductivity between the wafer W and the coolant via the protrusions 16C can be increased to uniformly control the temperature of the wafer W over the entire surface thereof. In this case, however, the temperature controllability of the peripheral portion of the wafer becomes lower than that of the inner portion thereof. At this time, by setting the density of the first protrusions to be greater than that of the second protrusions under the condition of a same percentage of contact area, the temperature controllability of the peripheral portion of the wafer via the thermally conductive gas can be improved. Further, by setting the first protrusions to have a lower height than that of the second protrusions, the temperature in the peripheral portion of the wafer can be reduced.

As described above, by dividing the space between the electrostatic chuck 16 and the wafer W into two and controlling the pressures of the thermally conductive gas therein individually, the temperature of the peripheral portion and the central portion of the wafer can be controlled independently. Therefore, an etching rate and an etching shape can be controlled uniformly over the entire surface of the wafer W even though, for example, a plasma state is unstable.

A distance between the second annular projection 16E and its nearest protrusions 16C disposed in the ring shape within the first and the second space 16F and 16G, is set to be not greater than 2 mm, preferably not greater than 1 mm and more preferably equal to or less than the thickness of the wafer W. In order to observe the influence of the gap between the second annular projection 16E and its nearest protrusions 16C upon the thermal conductivity, an experiment was conducted for cases where there were provided grooves with different widths between the projection and the protrusion, respectively, which were considered to promote such an influence.

Figure 6A:
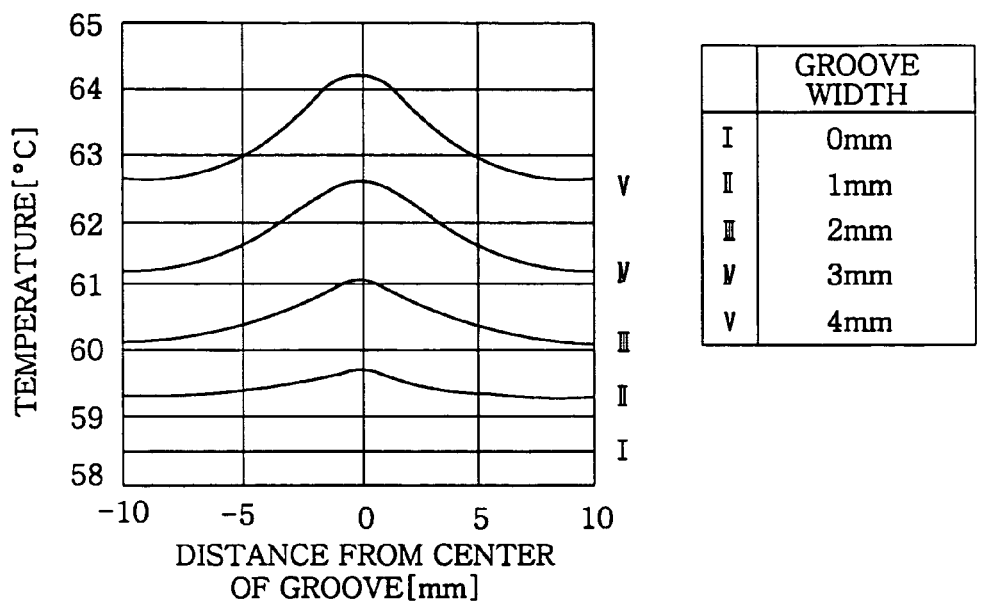
Figure 6B:
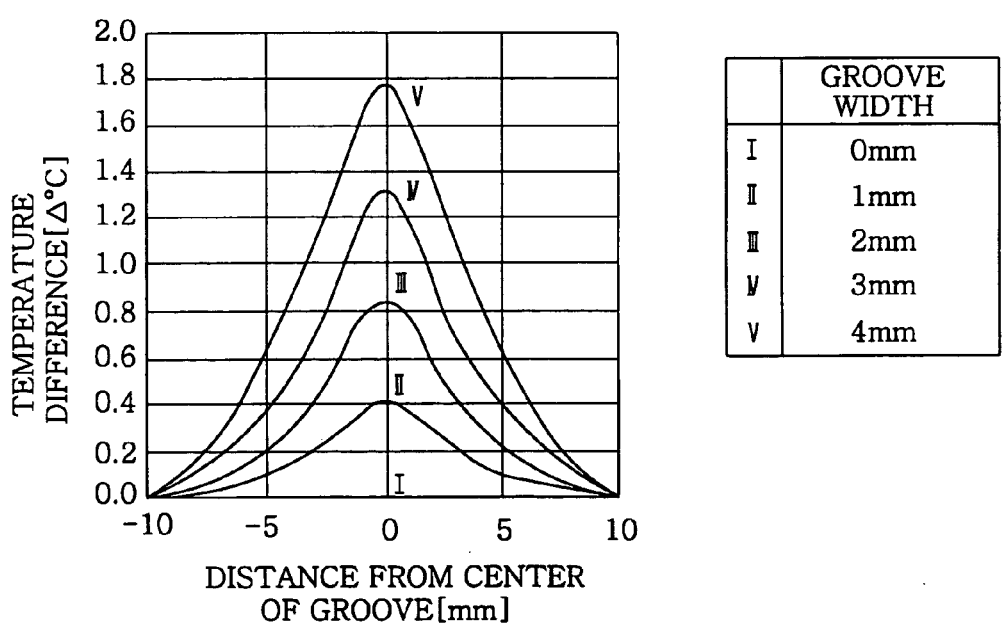

FIGS. 6A and 6B show results of thermal conductivity analysis obtained by using a finite element method under the following conditions. That is, a temperature distribution and a temperature difference distribution shown in FIGS. 6A and 6B, respectively, were obtained by setting the contact area percentage of the protrusion portions to be 15%, the height of each protrusion to be 30 µm, the pressure of a backside gas to be 15 Torr, and the thickness of the wafer to be 0.7 mm. Further, the temperature of the lower electrode was set to be 25° C.; a heat input of the wafer to be 3.4 W/cm²; and a depth of the grooves (with a relatively infinite length to the depth) to be 100 µm that is likely to promote the influence. Moreover, the results were obtained for each of five different cases where the widths of the grooves were set to be 0 mm, 1 mm, 2 mm, 3 mm and 4 mm, respectively.

Furthermore, a wafer coated with a resist was actually etched by using an oxygen plasma under the above-specified conditions and an etching rate was measured. The result showed that there was no influence of the grooves upon the etching of the resist in case the width of the grooves was 1.7 mm. By comparing the above analysis results with the experimental result, since the temperature differences between the width center of each groove and its peripheries fall within about 1° C. in case the groove width is 2 mm according to the analysis results in FIGS. 6A and 6B, it is understood that the width of the groove is preferably set to be 2 mm or less in order to keep the temperature difference at the peripheries of the groove not greater than 1° C. At this time, since the temperature difference increases in case the distance between the projection and the protrusions is greater than the width of the groove, the distance is preferably set to be not greater than 1 mm and, more preferably, not greater than the thickness of the wafer W. In this preferred embodiment, the distance between the second annular projection 16E and its nearest protrusions 16C is set to be 0.5 mm. Accordingly, a desired temperature distribution can be obtained over the entire surface of the wafer W without being affected by the second annular projection 16E even though the electrostatic chuck 16 is provided with the protrusions 16C having a lower percentage of contact area with the bottom surface of the wafer W.

An adsorption of the wafer W was performed under the following conditions: the contact area percentage between the wafer W and the protrusions 16C per unit area was 15%; each protrusion 16C has a columnar shape with a horizontal cross sectional diameter of 0.5 mm and a height of 30 µm; the pressures of the backside gas (He) were 5 Torr at the central portion and 40 Torr at the peripheral portion; and the electrode temperature was 60° C. A time period required to reach a temperature corresponding to 95% of a steady-state temperature was 14.4 seconds, and the degree of temperature responsiveness was substantially identical to that of the conventional electrostatic chuck fabricated by ceramic spraying. Therefore, in order to improve the temperature responsiveness, it was proved that it was preferable to set the contact area percentage between the wafer W and the protrusions 16c per unit area to be not greater than 15%, and to set the diameter of the horizontal cross section (contact surface with the wafer) and the height of each of the columnar protrusions 16c to 0.5 mm or less and 30 µm or greater, respectively, under the condition of a same contact area percentage. In this case, since the steady-state temperature increases, it is preferable to set a cooling capacity to be higher by, for example, decreasing the temperature of the coolant.

Figure 7A:
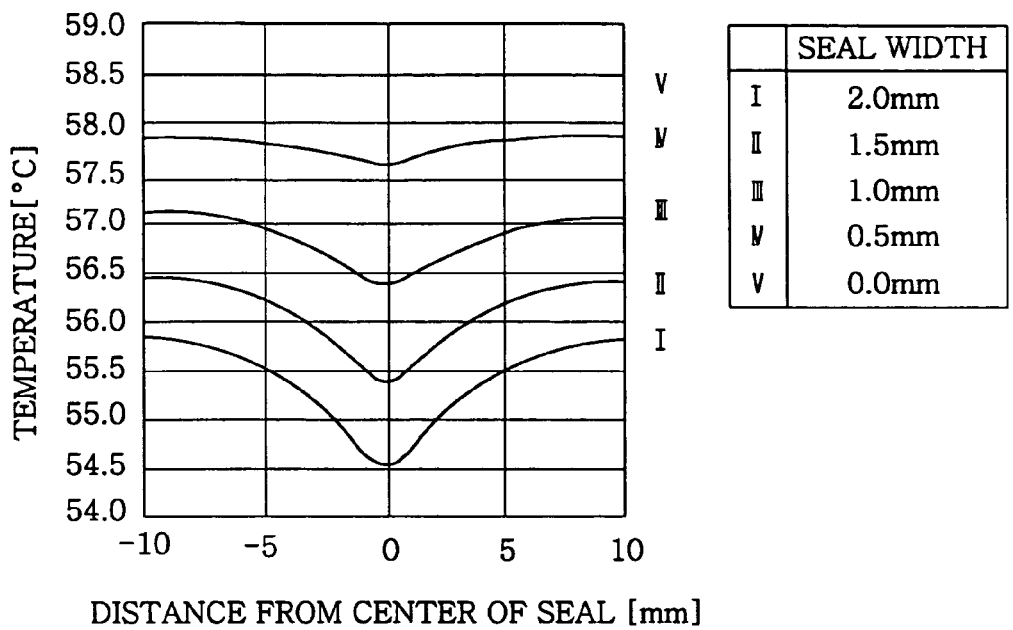
Figure 7B:
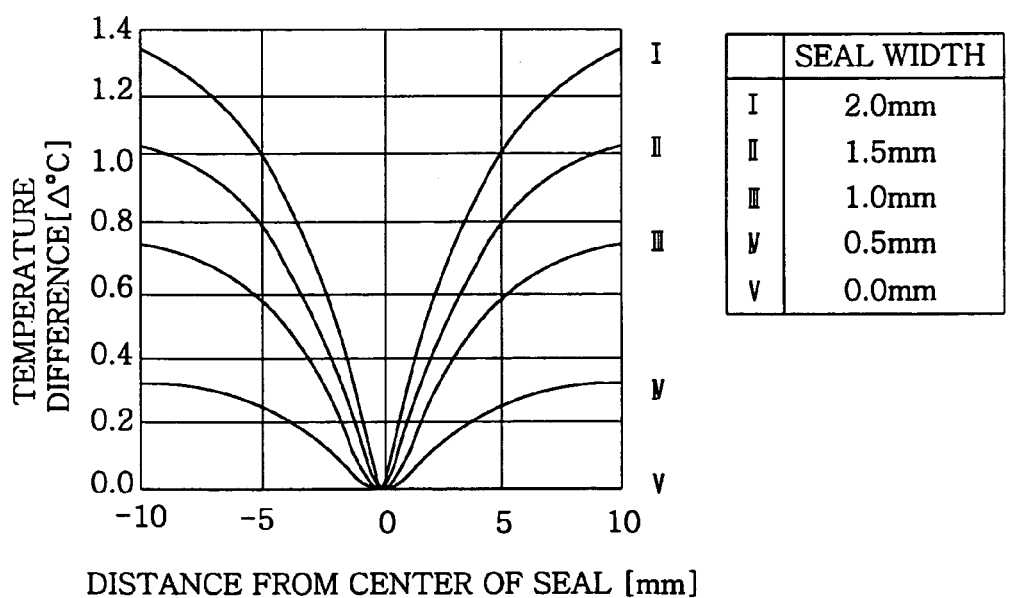

FIGS. 7A and 7B show a result of a thermal conduction analysis performed under the following conditions by using a finite element method in order to examine an influence of a sealing width of the first and the second annular projection 16D and 16E on a temperature distribution. In other words, a temperature distribution and a temperature difference distribution in the wafer, which are illustrated in FIGS. 7A and 7B, are results obtained under the following conditions: a contact area percentage of the protrusions set to be 15%; a height of the protrusion to be 30 µm; a backside gas pressure to be 15 Torr; a wafer thickness to be 0.7 mm; a temperature of a lower electrode to be 25° C.; a heat input to the wafer to be 3.4 W/cm²; a sealing height to be 30 µm; and respective sealing widths to be 0 mm, 0.5 mm, 1.0 mm, 1.5 mm and 2.0 mm.

Since, in terms of a resist etching rate, the temperature difference is preferably about 1° C. or less, it is preferable to set the sealing width to be 1.5 mm or less. At this time, an excessively narrow sealing width may cause a leakage of the backside gas, so that it is preferable to set the sealing width to 1 mm or greater. In terms of the gas leakage, in case a surface roughness Ra of the annular projection ranges from 0.2 µm to 0.3 µm, the sealing width needs to be greater than or equal to 3 mm in order to keep the gas leakage less than 1 sccm. In case of the second annular projection 15E, even if there is a gas leakage to some extent, an effect thereof is not considerable, so that it is preferable to set the sealing width to range from 1.0 mm to 1.5 mm.

Moreover, the ceramic dielectric 16A forming the electrostatic chuck 16 contains grains having a specified average particle diameter, and contact surfaces (top surfaces) of the protrusions 16C with the wafer W are formed (machined) to have a surface roughness that is dependent on the average particle diameter of the grains. The surface roughness depending on the average particle diameter of the grains means a stabilized surface roughness obtained when, by sputtering due to a dry cleaning using a plasma, a surface of the ceramic dielectric is changed with time to reach a final fixed surface roughness that is not further changed. The stabilized surface roughness becomes smaller as the average particle diameter of the grains decreases, while it becomes greater as the average particle diameter of the grains increases.

In this embodiment, the average particle diameter of the grains ranges from 1 μm to 2 μm, and the final surface roughness Ra due to the dry cleaning using a plasma comes to fall within a range from 0.2 μm to 0.3 μm. Thus, the protrusions 16C are machined in advance to have a surface roughness Ra ranging from 0.2 μm to 0.3 μm. Accordingly, even though the dry cleaning process is repeated multiple times, the surface of the protrusions 16C becomes not rougher than the above surface roughness range and a stable heat transfer performance can be maintained all the time, thereby stabilizing the temperature controllability of the wafer all the time. In case the average particle diameter of the grains is greater than 2 μm, the surface roughness is varied with time by the sputtering due to the plasma processing, so that the stabilized surface roughness becomes greater than 0.3 μm. Accordingly, top ends of the protrusions 16C need to be machined in advance to have a predetermined surface roughness greater than 0.3 μm. Meanwhile, in case the average particle diameter of the grains is smaller than 1 μm, the surface roughness is changed with time by the sputtering due to the plasma processing, so that the stabilized surface roughness becomes smaller than 0.2 μm. Therefore, the top ends of the protrusions 16C need to be machined in advance to have a predetermined surface roughness smaller than 0.2 μm.

Figure 8:
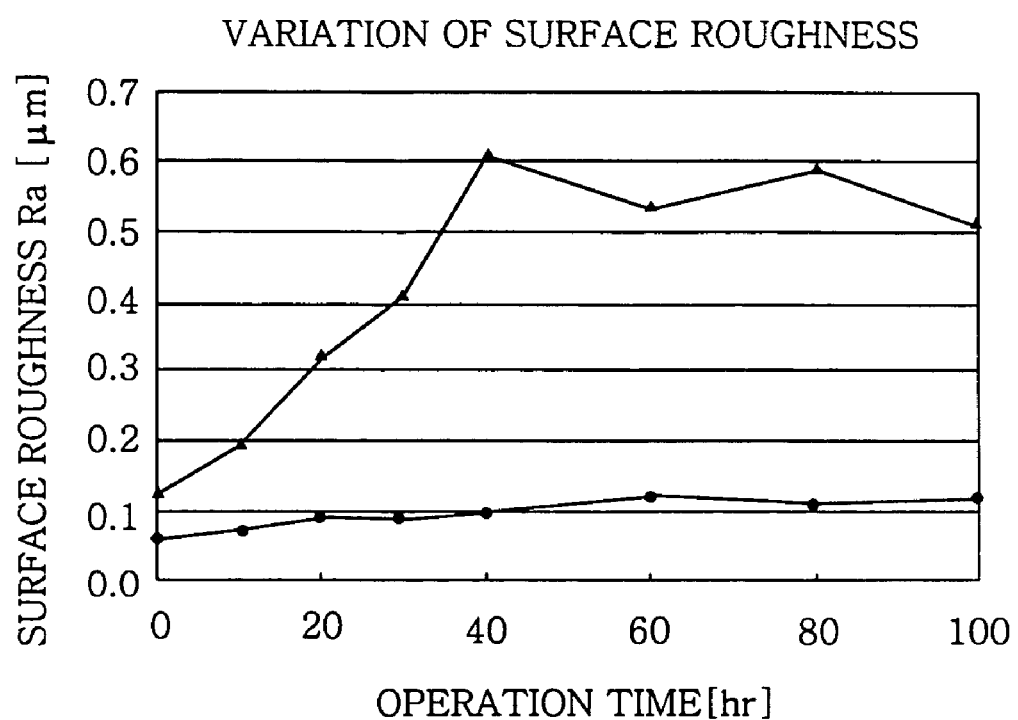
FIG. 8 is a graph showing aging variations in surface roughness of the electrostatic chuck illustrated in FIG. 1 and those of a conventional electrostatic chuck.

FIG. 8 provides a graph for comparing variations in surface roughness of the protrusions 16C in the electrostatic chuck of a high Vicker's hardness in accordance with this embodiment and a conventional electrostatic chuck excluded from the present invention, with respect to an operation time (a total time of a wafer dry cleaning process in which an electrostatic chuck is exposed to an $O_2$ plasma without mounting thereon the wafer W). Further, in FIG. 8, indicates the electrostatic chuck of this embodiment, and an average particle diameter of its grains ranged from 1 μm to 2 μm. Furthermore, represents the conventional electrostatic chuck, and an average particle diameter of its grains was 12 μm. As clearly can be seen from FIG. 8, the surface roughness of the conventional electrostatic chuck sharply increases from about 0.1 μm to about 0.6 μm for 40 hours after the beginning of the operation, and thereafter the surface roughness deteriorated to 0.5 μm to 0.6 μm is substantially stabilized. In contrast, the surface roughness of the electrostatic chuck 16 of this embodiment slightly increases from a value just below 0.1 μm at the beginning of the operation to a value just above 0.1 μm after 100 hours, and it is determined that the roughness by the plasma is insignificant.

Even if the grains have a different average particle diameter, since the surface roughness of the protrusions 16C is stabilized at a surface roughness depending on the particle diameter of grains, the aging variation in the surface roughness can be eliminated by machining in advance the protrusions such that they have a stable surface roughness. In other words, in case of the electrostatic chuck of this embodiment shown in FIG. 8, it is preferable to machine in advance the protrusions to have a surface roughness of about Ra 0.25 μm (the control range thereof is from Ra 0.2 μm to 0.3 μm due to a variation in a machining accuracy); and in case of the conventional electrostatic chuck, it is preferable to machine in advance the protrusions to have a surface roughness of about Ra 0.5 μm to 0.6 μm.

Preferably, the ceramic dielectric 16A forming the electrostatic chuck 16 is a sintered alumina body having aluminum oxide as a principal component and the sintered body preferably contains silicon carbide. By adding the silicon carbide, a hardness and an abrasion resistance can be enhanced. Further, more preferably, the electrostatic chuck 16 is a sintered body sintered under a condition of a high temperature and a high pressure. By sintering the electrostatic chuck 16 under the condition of a high temperature and a high pressure, the hardness thereof can be further enhanced, and a hardness higher than Vicker's hardness Hv 2000 can be obtained. Accordingly, the plasma resistance and the abrasion resistance can be further improved, and it is possible to prevent the top surfaces of the protrusions 16C from being roughed due to an adsorption and a separation of the wafer W.

Figure 9:
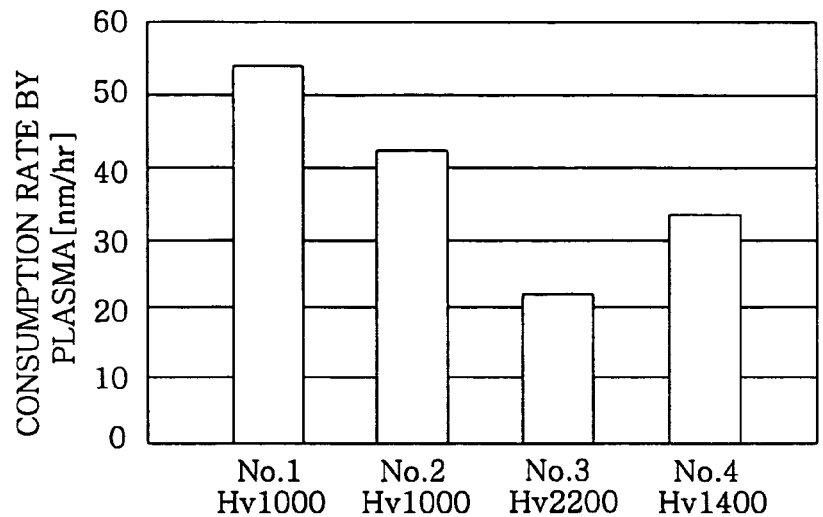
FIG. 9 depicts a graph illustrating relationships between the electrostatic chuck illustrated in FIG. 1 and conventional electrostatic chucks, and consumption rates thereof by a plasma.

FIG. 9 presents a graph for comparing the plasma resistance of a sintered body used in the electrostatic chuck 16 of this embodiment and that of another ceramic. Referring to FIG. 9, the sintered body used in this embodiment is represented by specimen No. 3, which contains silicon carbide and is sintered under a condition of a high temperature and a high pressure, wherein its Vicker's hardness Hv was 2200. Another specimen No. 1 is a general electrostatic chuck by an alumina spraying, and its Vicker's hardness Hv was 1000. Further, a specimen No. 2 is an electrostatic chuck made of a ceramic dielectric obtained by sintering a green sheet of aluminum oxide under an atmospheric pressure, and its Vicker's hardness Hv was 1000. Moreover, a specimen No. 4 is an electrostatic chuck which has as a principal component aluminum oxide and made of a ceramic dielectric sintered under different conditions from those applied to No. 2, wherein its Vicker's hardness Hv was 1400. As clearly can be seen from FIG. 9, any specimens other than this embodiment have the Vicker's hardness Hv lower than 2000 and, further, a consumption rate thereof by the plasma is higher, thereby deteriorating the plasma resistance.

Figure 10:
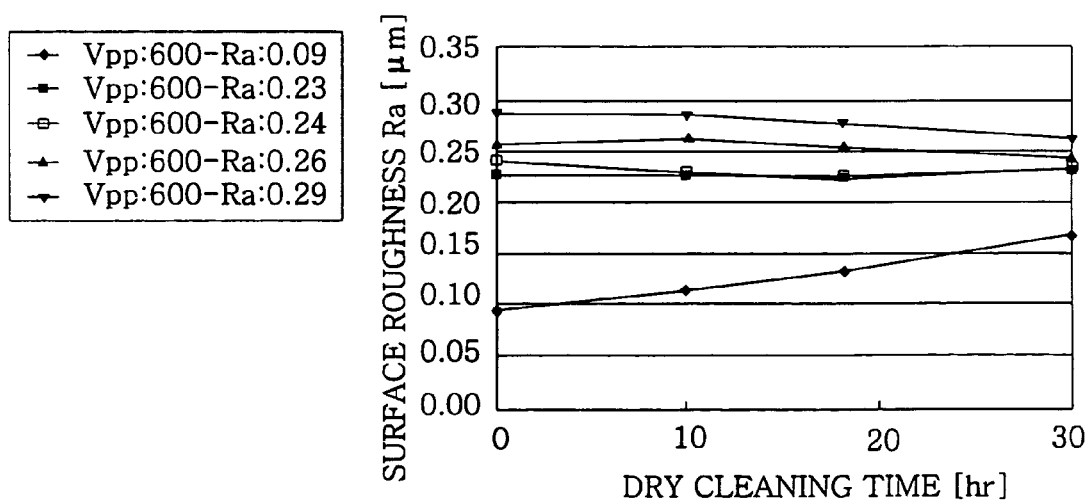
FIG. 10 provides a graph describing a relationship between the surface roughness of the electrostatic chuck shown in FIG. 1 and a dry cleaning.

FIG. 10 represents a graph illustrating a relationship between a surface roughness of the protrusions 16C in the electrostatic chuck 16 of this embodiment and a waferless dry cleaning time. The electrostatic chuck 16 employs a sintered body of alumina particles having a particle diameter of about 1 μm. Further, as shown in FIG. 10, the relationship between each of the electrostatic chucks 16 and the dry cleaning time was examined by machining the surfaces of the protrusions 16C such that the surface roughness Ra thereof ranges from 0.09 μm to 0.29 μm. As clearly can be seen from FIG. 10, it has been proved that, in all the electrostatic chucks 16, the surface roughness converges on a fixed value as the cleaning time passes, wherein the convergence value was Ra 0.25 μm. Such value can be converted into another surface roughness Ry of 1.7 μm. Moreover, a plasma potential Vpp during the waferless dry cleaning was 600 V.

Figure 11:
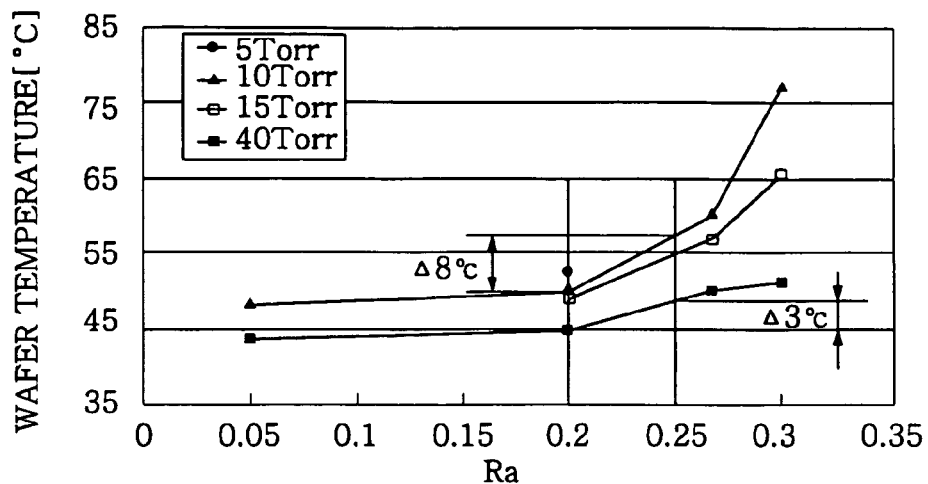
FIG. 11 presents a graph showing a relationship between a gas pressure of the thermally conductive gas, the surface roughness of the electrostatic chuck illustrated in FIG. 1 and a temperature of the wafer W.
Figure 12:
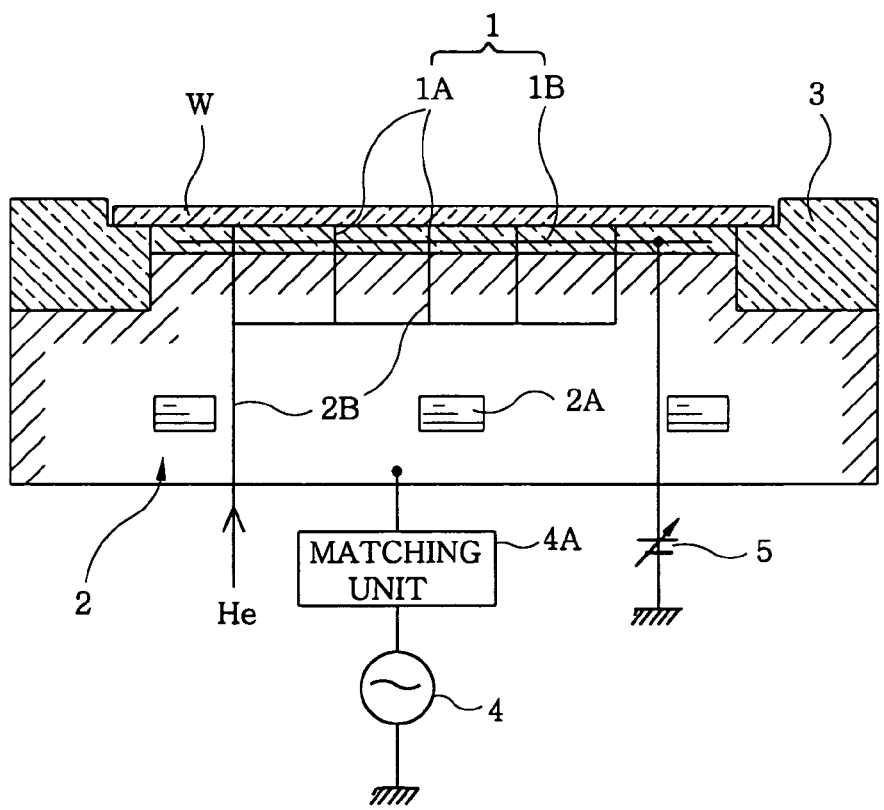
FIG. 12 represents a diagram depicting a plasma processing apparatus to which the conventional electrostatic chuck is applied.

FIG. 11 offers a relationship between a surface roughness of the protrusions 16C and a wafer temperature with respect to various pressures of a thermally conductive gas (He gas). As clearly can be seen from FIG. 11, in case the surface roughness Ra of the protrusions 16C is greater than 0.2 μm, the wafer temperature gradually increases and a cooling efficiency from the mounting table gradually deteriorates. Especially, the cooling efficiency rapidly deteriorates around the surface roughness Ra of 0.27 μm. However, in case the surface roughness Ra is smaller than 0.2 μm, the cooling efficiency becomes substantially stable. Therefore, even if there occurs a machining variation in the surface roughness Ra of the protrusions 16C in the range from 0.2 µm to 0.25 µm of the present invention, it is possible to keep a change in temperature of the wafer under 8° C. and 3° C. at the pressures of the thermally conductive gas of 10 Torr and 40 Torr, respectively, thereby maintaining a stable cooling efficiency. In other words, in case the surface roughness Ra on the top surfaces of the protrusions 16C is 0.25 µm or less, an effect of the surface roughness Ra is reduced. Meanwhile, in case it is 0.2 µm or less, the cooling efficiency becomes substantially stable. Further, 40 Torr and 10 Torr are pressures in the first and the second space 16F and 16G of the electrostatic chuck 16 of this embodiment.

When the top surfaces of the protrusions 16C are finished, by setting the surface roughness Ra preferably to 0.25 µm or less and, more preferably, 0.2 µm or less, the cooling efficiency is hardly affected by the surface roughness Ra even though the surface roughness Ra slightly changes due to the machining variation. Although the top surfaces of the protrusions 16C are designed to exhibit a specified contact area, an actual contact area thereof becomes smaller than the design value due to the effect of the surface roughness Ra. In case the surface roughness Ra is greater, a steady-state temperature of the wafer W increases under the same backside gas pressure, as illustrated in FIG. 11. Accordingly, in designing the electrostatic chuck, the steady-state temperature needs to be decreased by setting the surface roughness Ra smaller. The surface roughness Ra is preferably 0.25 µm or less and, more preferably, 0.2 µm or less, as described above.

As described above, in accordance with this embodiment, the electrostatic chuck 16 has the plurality of protrusions 16C being in contact with the wafer W. The protrusions 16C are formed of the ceramic dielectric 16A containing alumina grains having an average particle diameter ranging from 1 µm to 2 µm and the contact surfaces of the protrusions 16C with the wafer W are machined to a surface roughness (0.2 µm to 0.3 µm) depending on the average particle diameter, so that the plasma resistance thereof is increased. Moreover, even though the dry cleaning process is repeated, the surface roughness of the protrusions 16C is hardly changed. Accordingly, it is possible to increase and stabilize a controllability of a wafer temperature. Furthermore, there occurs no springing up of the wafer W due to residual electric charges, which is caused when the wafer W is separated from the electrostatic chuck 16, and there is no contamination from the electrostatic chuck 16.

Further, in accordance with this embodiment, the ceramic dielectric of the electrostatic chuck 16 may contain silicon carbide, thereby further enhancing the hardness and the abrasion resistance. Moreover, since Vicker's hardness Hv of the protrusions 16C is set to 2000 or greater, it is possible to enhance the abrasion resistance by the dry cleaning using a plasma.

Furthermore, since a contact area percentage of the protrusions per unit area of the wafer is set to be 15% or less, the controllability of the wafer temperature can be further increased, and the entire surface of the wafer W can be controlled to be at a desired temperature. Moreover, since the contact surface of each of the protrusions 16C is formed in a columnar shape having a diameter of 0.5 mm or less, the heat transfer performance by the protrusions 16C and the thermally conductive gas becomes better, and the wafer can be controlled to be at a desired temperature by the heat transfer from the thermally conductive gas being in contact with the wafer W. Besides, a distance δ between the protrusions 16C is set to be smaller than or equal to a distance corresponding to a thickness t of the wafer W. Accordingly, it is possible to uniformly heat a wafer portion that is not in contact with the protrusions 16C and a wafer portion being in contact with the protrusions 16C and, further, the entire surface of the wafer W can be cooled off to a desired temperature.

And also, since the protrusions 16C are set to have a height of 30 µm or greater, the thermally conductive gas can spread over the entire wafer W in a short period of time without forming grooves for the thermally conductive gas, thereby increasing a temperature responsiveness in the entire surface of the wafer W. Further, the electrostatic chuck 16 has the first and the second annular projection 16D and 16E and the first and the second gas supply ports 16H and 16I for supplying a thermally conductive gas into the first and the second space 16F and 16G formed between the first and the second annular projection 16D and 16E and inside the second annular projection 16E, respectively. Therefore, by individually controlling a pressure of the thermally conductive gas supplied into the first and the second space 16F and 16G to set a pressure of the thermally conductive gas in the first space 16F to be higher than that in the second space 16G, a temperature of the outer peripheral portion of the wafer W, which tends to increase, can be efficiently cooled off than that of the inner portion of the wafer W, thereby making it possible to control the entire surface of the wafer W to a desired temperature.

While the invention has been shown and described with respect to the preferred embodiments, it will be understood by those skilled in the art that various changes and modification may be made without departing from the spirit and scope of the invention as defined in the following claims.

What is claimed is:

1. An electrostatic chuck for attracting and holding a substrate by using an electrostatic force, comprising:
    a plurality of protrusion portions to be brought into contact with the substrate,
    wherein the protrusion portions are formed of a ceramic dielectric including grains, and contact surfaces of the protrusion portions contacting with the substrate are formed to have an initial surface roughness which is determined depending on an average particle diameter of the grains, and
    wherein the initial surface roughness is a surface roughness of the contact surfaces before the electrostatic chuck is initially subjected to a plasma cleaning process and a surface roughness of the contact surfaces is maintained to be substantially identical to the initial surface roughness even after the electrostatic chuck is repeatedly subjected to plasma cleaning processes.

2. The electrostatic chuck of claim 1, wherein the average particle diameter ranges from 1 to 2 µm and the surface roughness of the contact surfaces ranges from Ra 0.2 to 0.3 µm.

3. The electrostatic chuck of claim 1, wherein a principal component of the ceramic dielectric is aluminum oxide.

4. The electrostatic chuck of claim 3, wherein the ceramic dielectric includes silicon carbide.

5. The electrostatic chuck of claim 1, wherein the protrusion portions are set to have a hardness of Vicker's hardness Hv2000 or greater.

6. The electrostatic chuck of claim 1, wherein a contact area percentage of the protrusion portions per unit area of the substrate is set to be not greater than 15%.

7. The electrostatic chuck of claim 1, wherein the protrusion portions are formed of columnar protrusions, each having a diameter of 0.5 mm or less.

8. The electrostatic chuck of claim 1, wherein a distance between the protrusion portions is set to be not greater than 1 mm.

9. The electrostatic chuck of claim 1, wherein the protrusion portions are set to have a height of 30 μm or greater.

10. An electrostatic chuck for attracting and holding a substrate by using an electrostatic force, comprising:
- a first annular projection portion and a second annular projection portion respectively formed at an outer peripheral portion and an inner portion of the electrostatic chuck, the first annular projection portion and the second annular projection portion being brought into contact with the substrate; and
- first and second gas supply ports provided in a first region formed between the first annular projection portion and the second annular projection portion, and in a second region formed inside the second annular projection portion, respectively, a thermally conductive gas being supplied into the first region and the second region via the first and the second gas supply ports, respectively;
- wherein the first and the second region have a plurality of first and second protrusion portions different from the first annular projection portion and the second annular projection portion, respectively, and the first and the second protrusion portions are different from each other in at least one of a contact area per unit area with the substrate, a density and a height.

11. The electrostatic chuck of claim 10, wherein a percentage of the contact area per unit area between the first protrusion portions and the substrate is set to be greater than that of the contact area per unit area between the second protrusion portions and the substrate.

12. The electrostatic chuck of claim 11, wherein the percentage of the contact area between the second protrusion portions and the substrate is set to be not greater than 15%.

13. The electrostatic chuck of claim 10, wherein the first protrusion portions are set to have a height lower than that of the second protrusion portions.

14. The electrostatic chuck of claim 10, wherein the second protrusion portions are set to have a height of 30 μm or greater.

15. The electrostatic chuck of claim 10, wherein the density of the first protrusion portions is set to be greater than that of the second protrusion portions.

16. The electrostatic chuck of claim 10, wherein each of the first and the second protrusion portions has a columnar shape with a same diameter of 0.5 mm or less.

\* \* \* \* \*